(12) United States Patent
Batista Oliveira Costa Leal (10) Patent No.: US 9,923,344 B2
(45) Date of Patent: Mar. 20, 2018

(54) SYSTEM FOR OPERATING AND MONITORING POWER CABLES

(71) Applicant: Miguel Batista Oliveira Costa Leal, Lisbon (PT)

(72) Inventor: Miguel Batista Oliveira Costa Leal, Lisbon (PT)

(*) Notice: Subject to any disclaimer, the term of this patent is extended or adjusted under 35 U.S.C. 154(b) by 101 days.

(21) Appl. No.: 14/906,252

(22) PCT Filed: Jul. 9, 2014

(86) PCT No.: PCT/IB2014/062980
§ 371 (c)(1),
(2) Date: Jan. 19, 2016

(87) PCT Pub. No.: WO2015/008196
PCT Pub. Date: Jan. 22, 2015

(65) Prior Publication Data
US 2016/0172827 A1    Jun. 16, 2016

(30) Foreign Application Priority Data

Jul. 16, 2013    (PT) .......................................... 107067

(51) Int. Cl.
*H02B 7/06* (2006.01)
*H02G 9/02* (2006.01)
(Continued)

(52) U.S. Cl.
CPC ................. *H02B 7/06* (2013.01); *H02G 9/02* (2013.01); *H03H 7/0115* (2013.01); *H04B 3/54* (2013.01);
(Continued)

(58) Field of Classification Search
CPC .......... H02B 7/06; H02G 9/02; H03H 7/0115; H04B 3/54; H04L 5/0055; G01D 4/008;
(Continued)

(56) References Cited

U.S. PATENT DOCUMENTS

2003/0158677 A1* 8/2003 Swarztrauber ......... G01D 4/008
702/62
2005/0137813 A1* 6/2005 Swarztrauber ......... G01D 4/008
702/62
(Continued)

*Primary Examiner* — Orlando Bousono
(74) *Attorney, Agent, or Firm* — Arent Fox LLP (57) ABSTRACT

The present invention refers to a system for remotely operating and monitoring the integrity of HV/MV/LV (High Voltage/Medium Voltage/Low Voltage), mono phasic or three-phase, power cables, regardless of the cable being under tension, wherein the protection against theft of power cables is one of several advantageous uses. The present invention is based on the principle of two-way communication between two modules, installed one on each end of the cable being operated and/or monitored, using the cable itself to communicate and is characterized by a communication Master module installed upstream to the infrastructure, Slave modules, installed at each end located downstream, and bypass modules to pass through circuit breakers. The system is based on determining the cable cutout (alarm condition sent via GSM/GPRS) when the communication between Master and Slave modules is interrupted. The present invention is applicable in the power cable industry and every other industry depending on power cable's integrity.

17 Claims, 5 Drawing Sheets

(51) Int. Cl.
    *H03H 7/01*       (2006.01)
    *H04B 3/54*       (2006.01)
    *H04L 5/00*       (2006.01)

(52) U.S. Cl.
    CPC ....... *H04L 5/0055* (2013.01); *H02G 2200/10* (2013.01)

(58) Field of Classification Search
    CPC .... G01R 22/00; G06Q 30/0283; G06Q 50/06; H02J 13/002
    See application file for complete search history.

(56) References Cited

U.S. PATENT DOCUMENTS

| | | | |
|---|---|---|---|
| 2006/0259254 A1* | 11/2006 | Swarztrauber | G01D 4/008 702/64 |
| 2009/0099801 A9* | 4/2009 | Swarztrauber | G01D 4/008 702/64 |
| 2009/0132096 A1* | 5/2009 | Swarztrauber | G01D 4/008 700/295 |
| 2010/0004792 A1* | 1/2010 | Lopez | G05B 23/0291 700/292 |
| 2010/0085189 A1* | 4/2010 | Caswell | G08B 13/1409 340/571 |
| 2010/0328072 A1* | 12/2010 | Price | G08B 13/00 340/568.3 |

* cited by examiner

SYSTEM FOR OPERATING AND MONITORING POWER CABLES

CROSS-REFERENCE TO RELATED APPLICATIONS

This application is a National Stage entry of International Application No. PCT/162014/062980 filed Jul. 9, 2014, which claims the benefit of priority of Portuguese Application No. 107067 filed Jul. 16, 2013, the disclosure of these prior applications are hereby incorporated in their entirety by reference.

FIELD OF THE INVENTION

The present invention refers to a system for remotely operating and monitoring the integrity of HV/MV/LV (High Voltage/Medium Voltage/Low Voltage), mono phasic or three-phase, power cables. The present invention is applicable in the power cable industry and every other industry depending on power cable's integrity, such as electric cable anti-theft systems, irrigation systems, communication systems, among others.

STATE OF THE ART

There are currently some monitoring systems, in particular anti-theft systems of electric or power cables and metal (or other electrical conductors) in irrigation systems, based on principles differing from the principle on which the present invention relies:

Document CN102540014 describes a method based on detecting the cut through the measure of the resistance of the steel shield of the cable and of one of the internal conductor wires of the same cable. Furthermore, short pulses are applied for which the measured time of reflection varies as a function of the cable's length. If the cable is interrupted, the return period is lower, the resistance of the steel shield plus internal conductor wire changes and the alarm condition is activated.

Document CN202159397 describes a method for preventing the theft of electrical cables through combined monitoring of voltage and current.

Another cable anti-theft method is disclosed in the document CN101950458 regarding infrastructures for public illumination lamps. The disclosed method is based on the placement of capacitors next to each lamp, which is equivalent to a resonance frequency for a certain group of lamps. Cutting a cable changes the resonance frequency and the alarm condition is thereby activated.

Document CN101114007 describes an anti-theft system of electric cables, by applying a small electric charge on the line, in a way that even if there is no consumption, at least the imposition of that charge allows knowing if the cable was interrupted.

Document CN201274077 describes an anti-theft system of electrical cables based on the principle disclosed in document CN101114007, i.e. the detection of the cable cutout is made when the line current is zero, because under normal circumstances, at least the imposed reference current should be measured.

Document CN201017757 describes another anti-theft system of electrical cables under the principle of the change of impedance of the infrastructure when the cable is cutted.

Document CN 202632454 discloses an anti-theft alarm for a road lamp cable, comprising an anti-theft host and an anti-theft terminal, the anti-theft host comprising a microprocessor, a multi-serial communication converting circuit, a three phase low voltage power carrier wave data transmit-receive circuit, a three-phase power carrier wave modulation and demodulation interface circuit and a local alarm output circuit. This document does not disclose an electronic device comprising at least one bypass module comprising at least one LC series filter, providing an additional technical effect.

Document CN 201514691 discloses an electrical equipment protection system, in particular an electrical anti-theft call system based on a GSM network, for monitoring the operation of the electrical equipment and rapidly issues an alarm in case of abnormal condition. Nevertheless, this document taken alone or in combination with others does not teach a skilled person towards the solution of the present invention.

U.S. Pat. No. 7,880,612 B2 discloses a method and alarm device used to prevent metal theft from irrigation systems. The alarm device attaches to a plurality of electric conductor such as copper wiring that is in need of protecting and the preexisting irrigation system circuit. The alarm device detects voltage in the irrigation system circuit and if there is no voltage signals from the irrigation system circuit, then the alarm device automatically breaks the original circuit and inserts itself into the irrigation system circuit. The alarm device then sends a low voltage, low current down the plurality of electric conductors and the plurality of conductors then become part of a circuit that energizes a magnetic switch located in the alarm device. A breach of integrity of the plurality of conductors such as by physical detachment triggers an alarm condition which lead to audio and visual alarms plus activating an automated dialer. The present invention differs from this method in the operation principle, which involves communication between modules using power lines as communication channel and bypass modules to pass through open circuit breakers, which allows the survey and monitoring of several pivots with the same system (regardless of the maneuvering of circuit breakers). At the same time, the communication between modules allows the remote operation and status control of the irrigation system pivots, power transforming stations and pumps.

DESCRIPTION OF THE INVENTION

The present invention refers to a system comprising an electronic device for remotely operating and monitoring the integrity of HV/MV/LV (High Voltage/Medium Voltage/Low Voltage), monophasic or three-phase, power cables, regardless of the cable being under tension, wherein the protection against theft of power cables is one of several advantageous uses.

1—Anti-Theft Systems

One of the preferred embodiments refers to an anti-theft electronic system for power cables, which may comprise copper or any other electrical conductor.

Copper-wire theft is at or near an all-time high, thanks to a general economic malaise, high prices paid by scrap metal dealers, and the relative ease with which wire can be stolen from unguarded locations and resold to recyclers who don't inquire the origin of these cables. During the height of the recession in the United States, metal thieves targeted foreclosed and abandoned houses. Now that those structures have been stripped clean, they're setting their sights on bigger targets. In Australia, in 2008, 8 tonnes of copper wiring, is believed to have been stolen from a variety of locations including rail tracks, power stations and scrap metal depots, destined for the Asian black market. In Quebec, during May 2006, thieves stole sections of copper roofing, gutters and wiring from four Quebec city churches, two being St. Charles de Limoilou and St. Francois d'Assise.

The thieves were discovered in action on their third night, whereupon they fled. High copper prices are believed to be the reason for the thefts. Repairs were expected to cost more than 40,000 Canadian Dollars. In September 2011, Peterborough, Ontario, experienced a four-hour power outage north of the city when thieves stole power transmission wires. In Haiti, after the 2010 Haiti earthquake, some looters were reported to be removing rebar from the concrete of collapsed buildings in order to sell it. Others hacked up downed power lines.

Metal theft in South Africa is rampant, with an estimated of R5 billion per annum lost due to the theft. The stolen metal ranges from copper cables, piping, bolts to manhole covers. The theft continuously disrupts and degrades services, such as the power supply provided by Eskom and the telecommunication services by Telkom. Eskom estimated that the theft has cost the company about R25 million per annum, with incidents increasing from 446 incidents in 2005; 1,059 in 2007 and 1,914 in 2008. The theft has cost Telkom R863 million (April 2007-January 2008 period). Significant rises in metal theft were observed during 2006-2007 in the UK, especially in North West England, where metal theft is still on the rise as of 2008. Police Review have said that metal theft is now the fastest growing crime in the UK (for 2008) with the annual damage to industry estimated at £360 m.

According to the present invention, the operation and monitoring of the power cables are preferably performed remotely.

In a preferred embodiment, the master module (4) periodically sends requests to slave module(s) and the response message of each inquired slave module is:
 (i) ACK or ACKNOWLEDGE, when communication is effective;
 (ii) NACK or NOT ACKNOWLEDGE, when communication is occurring with errors and master (4) triggers the alert condition; or
 (iii) No response, when communication is interrupted and master (4) triggers the alarm condition.

Communication between master (4) and slave(s) (12) modules is carried out by injection on the power cable (6) of a high frequency carrier wave, modulated to represent state 0 and/or 1 for each bit, wherein each group of bits is sent when centered at zero voltage. The circuit comprises at least one protective device, preferably a circuit breaker (7), preferably connected parallel to the bypass module (9), wherein the circuit breaker (7) can cause the interruption of the cable by opening power contacts and the existent bypass module (9) allows the passage of such high frequency carrier wave and therefore, in this case, communication is not interrupted.

Communication is interrupted when the power cable (6) is ruptured outside the circuit breaker (7) and the alarm is triggered by the master module (4).

The bypass module (9) comprises at least one LC series filter, the resonant frequency of which is near to the value of the high frequency carrier wave.

The support operative software according to the present invention is preferably in a web server and periodically sends requests for response to the master module (4) and the response message from the master module is:
 (i) ACK or ACKNOWLEDGE, when communication is effective;
 (ii) NACK or NOT ACKNOWLEDGE, when communication is occurring with errors and the support operative software triggers the alert condition; or
 (iii) No response, when communication is interrupted and the support operative software triggers the alarm condition.

The present invention is used in remotely operating, monitoring and preventing theft and damage of power cable(s) (6) and/or communication modules, such as GSM/GPRS antennas wherein the triggered alarm is connected to a web server and informs the operator that because the communication has been interrupted, a deleterious event or attempt, such as a theft, an accident or an attack, has occurred.

Communication between master module (4) and slave module (12) is not interrupted when the GSM/GPRS module (17) is damaged or missing and the alarm is triggered by the software according to the present invention.

Regardless of how the alarm is triggered, the alarm is associated to a web server which informs the operator that, because the communication has been interrupted, a deleterious event or attempt, such as a theft, an accident or an attack, has occurred.

2—Irrigation Systems

The present invention also applies to irrigation systems (irrigation pivots (30), pumps (13) and power transformers (31)).

A system according to the present invention is used in remotely operating, monitoring and preventing theft and damage of irrigation systems wherein the irrigation systems comprise at least one power transformer (31), at least one irrigation pump (13), at least one irrigation pivot (30) and at least one electric distribution enclosure (3). It may also comprise at least one master module (4) installed in a, at least one, electric distribution enclosure (3), at least one slave module (12) and at least one bypass module (9) wherein at least one bypass module (9) is installed in each electric distribution enclosure (3).

In a preferred embodiment (FIG. 6), a system according to the present invention comprises a power transformer (31), an irrigation pump (13), four irrigation pivots (30), six electric distribution enclosures (3), a master module (4) installed in a main electric distribution enclosure (3) and comprising a single GSM/GPRS module, ten slave modules (12):
 (i) a slave module installed in the power transformer (31);
 (ii) a slave module installed in the pump (13); and
 (iii) two slave modules installed in each pivot (30),
and six bypass modules (9) wherein one bypass module (9) is installed in each electric distribution enclosures (3). The usual state of the art available solution provides an irrigation system with five GSM/GPRS modules (one for each pivot (30) and one in the pump (13)), which requires significantly increased communication costs, when compared to the above mentioned embodiment of the present invention, containing a single GSM/GPRS module.

The present invention also allows the operation of all equipments regardless of the state of the existent circuit breakers.

BRIEF DESCRIPTION OF DRAWINGS

(9) Bypass module(s);
(10) Motor's connector terminals;
(11) Cable(s) for supplying power to the slave module(s) and HF communication;
(12) Slave module(s);
(13) Motor/pump.

DETAILED DESCRIPTION OF THE INVENTION

Figure 1:
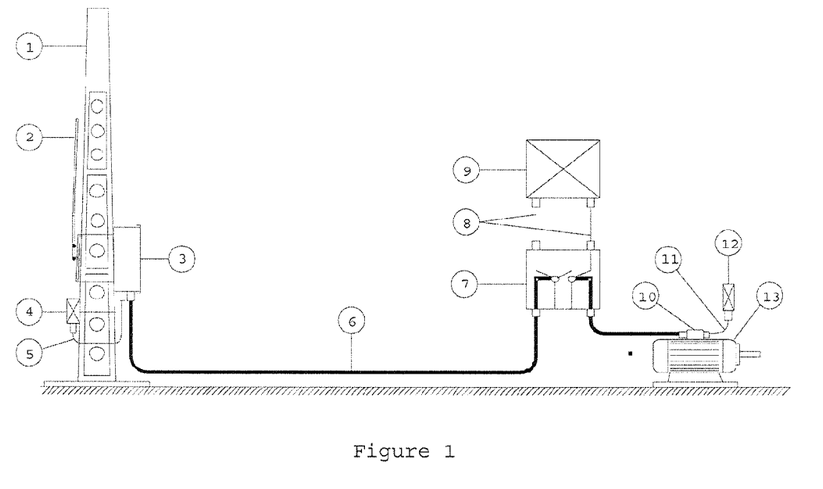
FIG. 1—Embodiment for the system of the invention, comprising:
 (1) Tower comprising a power transformer;
 (2) Cable(s) and circuit breaker(s);
 (3) Electric distribution enclosure(s);
 (4) Master module(s), comprising at least one GSM/GPRS module (17);
 (5) Cables) for supplying power to the master module and HF communication;
 (6) Power cable(s);
 (7) Circuit breaker;
 (8) Cable(s) connecting the circuit breaker (7) to the bypass module (9)

The system of the present invention for preventing the theft of electrical cables of any given voltage HV/MV/LV (High Voltage/Medium Voltage/Low Voltage) comprises the following modules, a preferred embodiment of which is provided in FIG. 1: at least one master module(s) (4), at least one slave module(s) (12) and at least one bypass module(s) (9).

The alarm condition is triggered by at least one interrupted cable or by damaging the communication module, p.ex. an GSM/GPRS module, and is based on the following principle: A standard installation, according to FIG. 1, intends to protect the power cable(s) (6), with installed Master module(s) (4) upstream to the mentioned cable(s) and the Slave module(s) (12) located downstream, communicating bi-directionally, with each other, periodically, wherein a circuit breaker (7) located downstream to the, at least one, power cable (6) is connected to the, at least one, bypass module (9) through cable(s) (8) and the mentioned alarm condition is activated when communication between modules ceases.

Communication between modules is carried out by the injection, on the power cable(s) (6) to protect, of a HF (high frequency) carrier wave, modulated to represent states 0/1 for each bit. The information is sent centered at zero voltage. When a module transmits, the other is receiving, being always the Master module the one to trigger the communication.

In a situation where the existence of a protective device or a circuit breaker (7) causes the interruption of the cable by opening power contacts, the existent bypass module (9) allows the passage of a communication HF signal, since it's transparent to the communication frequency and opaque to the power mains frequency.

FIG. 1 discloses a typical embodiment of the present invention, which aims to protect the power cable (6). Electric current originated in a power transformer (not shown) installed in the tower (1), descends through the cable and circuit breaker (2) and ends in an electric distribution enclosure (3).

At one end, upstream to cable (6) and connected to the electric distribution enclosure (3) through cable (5), is the Master module (4). This connection allows, in addition to the power supply for the Master module (4), the injection of a HF communication carrier in cable (6), monitoring it.

Downstream to cable (6) there is a circuit breaker (7) to which the bypass module (9) is connected through cables (8), allowing the HF communication carrier wave to transpose the circuit breaker (7) even when it is opened. The other end of cable (6) is connected to pump connector terminals (10) of motor/pump (13), on which the Slave module (12) is installed, connected through cable (11), being the function of this connection the module power supply and the HF communication, as explained previously regarding Master module (4).

Figure 2:
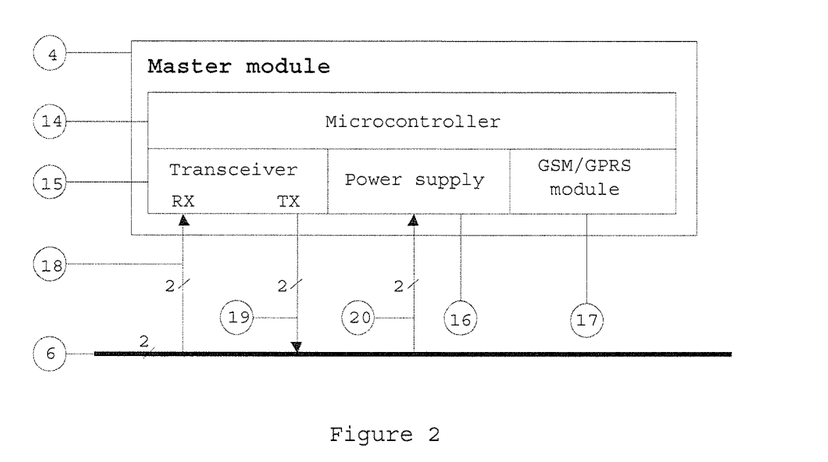
FIG. 2—Master module (4) comprising:
(14) Microcontroller;
(15) Transceiver;
(16) Power supply;
(17) at least one communication module, preferably GSM/GPRS module(s);
(18) Transceiver receiving section (RX) cable;
(19) Transceiver transmission section (TX) cable;
(20) Feeder cable;
(6) Power cable.

The Master module (4) on FIG. 2 comprises the following functional blocks: The microcontroller (14) that implements all the logic control, communications, alarm and alert conditions. The transceiver (15), which is the specific hardware to transmit and receive data according to the principle of a modulated HF carrier, on the power cable. The power supply (16) is responsible for assuring energy supply to the electronic section of the module. The GSM/GPRS module (17) is for remote communication. The receiving section (RX) of the transceiver block (15) is connected to the power cable (6), through cable (18) which receives data from the power cable (6). The transmitting section (TX) output of the same module, is connected to the mentioned power cable (6) through cable (19), which sends data to the power cable (6). The power supply (16) is also connected to power cable (6) through cable (20).

In FIG. 2, all cables (6, 19 and 20) are marked as having 2 internal conductor wires because even if it is a three phase cable (6), the communication is always done through 2 of them.

Figure 3:
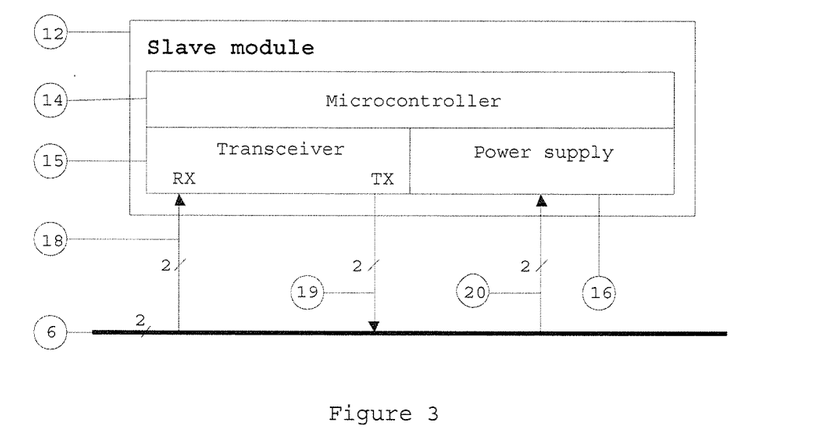
FIG. 3—Slave module (12) comprising:
(14) Microcontroller;
(15) Transceiver;
(16) Power supply;
(18) Transceiver receiving section (RX) cable;
(19) Transceiver transmission section (TX) cable;
(20) Feeder cable;
(6) Power cable.

Regarding FIG. 3, representing the Slave module (12), it should be noted that from the point of view of functional electronic blocks, except for the GSM/GPRS module, everything else is identical to the master module (4). Thus we have: The microcontroller (14), responsible for the logical operation of the module. The transceiver (15), responsible for receiving and transmitting data, according to the requests of Master (4), the input and output lines RX and TX, connect to the power cable (6), respectively through cables (18) and (19). The power supply (16) connects to the mentioned power line (6), through cable (20).

The, at least one bypass module (9) comprises at least one LC-series filter, with resonant frequency near to the value of the HF communication carrier. The resonant circuit of the LC-filter theoretically offers zero impedance for the HF communication carrier frequency and a very high resistance to the mains frequency.

The interaction between modules works as follows, considering also FIG. 1: The Master module (4) periodically sends requests to Slave module (12) and this one must return to the Master module (4), the message "ACK" or "NACK" (acknowledge or not acknowledge), provided that the information reaches its target, respectively, without or with error. If Master (4) receives the "ACK" reply, it waits a few seconds before repeating the process. If the answer is "NACK", the Master module (4) performs 3 attempts before triggering the alert condition.

As previously mentioned, the total lack of response by Slave module (12) implies that Master module (4) triggers the alarm condition, given that communication ceases only if the power cable (6) is interrupted, considering therefore a possible cut of the cable.

In resume, communication between modules can create three different situations: Master receives "ACK" and that means communication is ok, Master receives "NACK" and that means communication is occurring with errors (Master triggers Alert condition, not Alarm) and Master don't receive any answer that means communication is interrupted (Master triggers Alarm condition).

Figure 4:
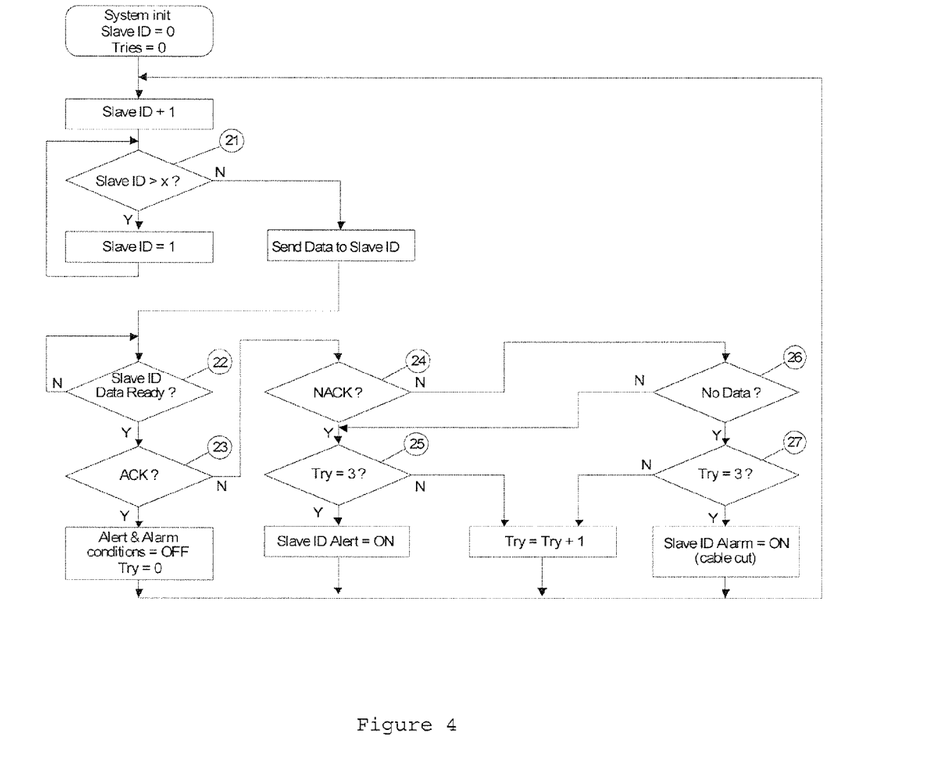
FIG. 4—Operative flowchart of the high level logic layer, alarm and alert condition, comprising:
(21) Slave ID overflow node;
(22) Slave ID Data Ready node;
(23) acknowledge node;
(24) not acknowledge node;
(25) Number of tries counter node;
(26) No Data node;
(27) Number of tries counter node.
Figure 5:
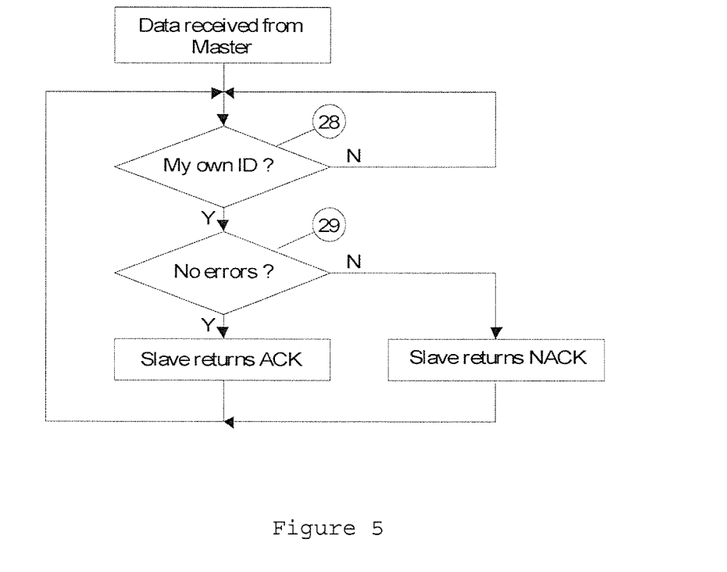
FIG. 5—Operative flowchart of communication between Slave and Master modules:
(28) My own ID node;
(29) No errors node.

The procedure of communication previously described also occurs between the Master module (4) and the support software resident in a web server, and in this case, the supporting software periodically sends requests for response to the Master module (4), and if it does not get a response (situation caused by destruction of the GSM/GPRS module antenna, for example) the support software triggers an alarm (FIGS. 4 and 5).

FIG. 4 shows the operative flowchart of the high level logic layer, alarm and alert condition. As noted above, based on the logic of monitoring the power cable (6) by communication between 2 modules located at both ends of the cable, on one end the Master module (4) that interrogates the Slave module (12) and on the other end the Slave Module (12) that responds or not, as a result of the integrity of the power cable (6). The communication between modules, whereas there may be several Slaves (12), comprises the addressing of these by the Master module (4) and the response of Slave modules (12) could assume one of two possible conditions, according to the success of the communication, i.e. with error (NACK) or without error (ACK). A third condition exists when the power cable (6) is cut, that implies no response from Slave module (12).

According to FIG. 4, Master module (4) inquires all Slaves (12) sequentially, one at a time, by selecting the appropriate Slave ID. Firstly it resets the number of tries and Slaves ID. Afterwards, value 1 is added to the previous ID, because Slaves are numbered from 1 to n. The node "Slave ID" (21) verifies if Slave ID is greater than the maximum number of ID of the installation and sets it to 1 in case of true, otherwise Master sends data to Slave (inquiring it) and stops in the node "Slave ID Data Ready" (22) awaiting for the Slave response.

The waiting loop of node "Slave ID Data Ready" (22) will end after Master receives a response from the Slave and stops in the node "ACK" (23). After that, node (23) verifies if the returned data is an ACK. In case of ACK is validated, that means the data reached the slave without error, the Master finishes the procedure after turning off the alarm and alert conditions and sets the try counter to 0. (The term "try" in FIG. 4 means "attempts before action").

Back to node "ACK" (23), if Slave returns back a different response than ACK, it goes to node "NACK" (24) to verify if the response is NACK. In case of NACK, Alert condition is activated by Master but only after three attempts, verified by node "Try=3" (25), if not, attempt counter will be incremented (Try=Try+1).

Back to node "NACK" (24), in case of lack of Slave response evaluated by node "No Data" (26), Master will assume Alarm condition only after three attempts, like mentioned before. Back to node "No Data" (26), in case of Slave response different than ACK and NACK, the Master will assume wrong data, and in this case, Alert condition will be triggered after three tries.

Note that the execution sequence of the flowchart works in loop way.

According with FIG. 5 "Operative flowchart of communication between Slave and Master module(s)", the response of each inquired Slave can assume three different predefined conditions; send back a ACK, NACK or no response. Whenever a Master inquire arrives to node "My own ID" (28) it checks if the ID is correct. If the ID is not correct, Slave returns nothing. In case of correct ID, it goes to node "No Errors" (29) and send ACK if true condition, otherwise it sends NACK.

As noted before, the communication is based on sending information by modulating a HF (high frequency) carrier to determine each state of data bit sent that is injected into the power cable (6), the same which is under monitoring.

In one embodiment, for each half-cycle, information bits are sent in reversed order, compared to RS232 communication. Each group of bits are sent, centered with the zero of the AC voltage, because this is the range experiencing lower noise and interference.

Figure 6:
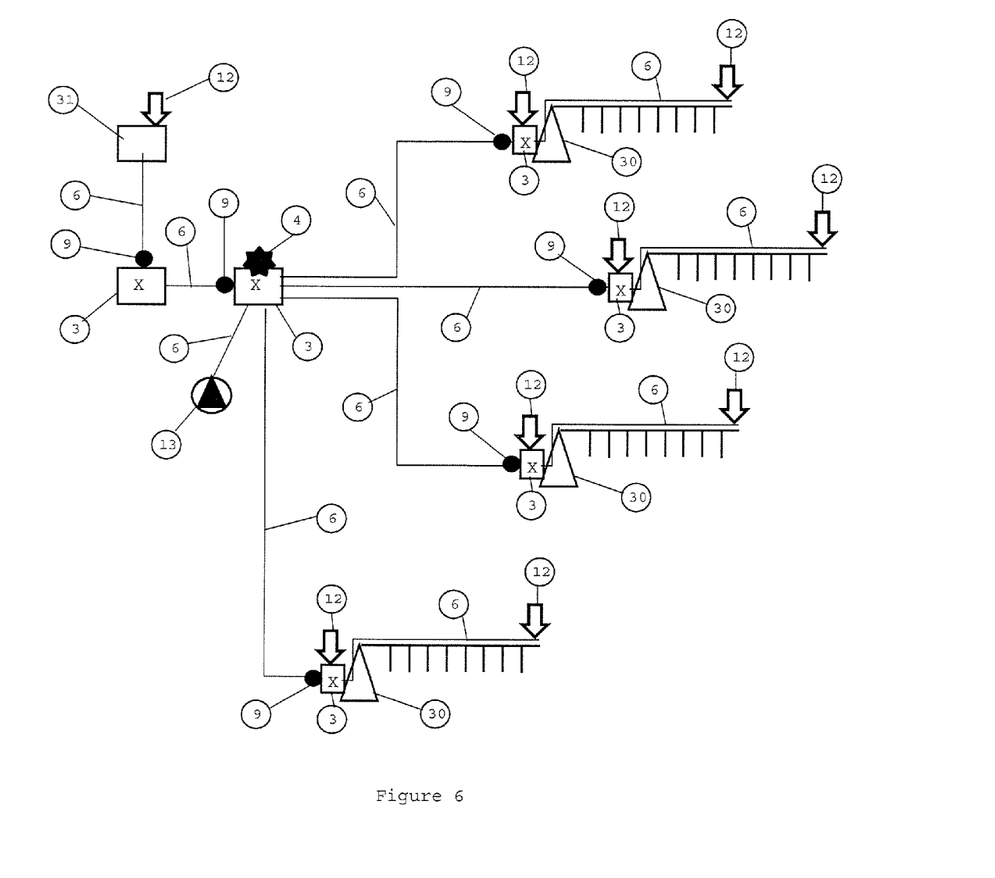
FIG. 6—Implementation of the invention on a typical irrigation system, comprising:
(30) Irrigation pivot;
(31) Power transformer;
(3) Electric distribution enclosure;
(4) Master module;
(6) Power cable(s);
(9) Bypass module(s);
(12) Slave module(s);
(13) Motor/pump.

According to FIG. 6, implementation preferred embodiment of the present invention in an irrigation system comprising one power transformer (31), one irrigation pump (13), four irrigation pivots (30) and six electric distribution enclosures (3) (with circuit breakers), comprises the installation of one master module (4) (in the main electric distribution enclosure (3)), ten slave modules (12), (one installed in the power transformer (31), one in the pump (13) and two in each pivot (30)) and six bypass modules (9) (one in each electric distribution enclosure (3)).

This solution allows the monitoring and protection of all irrigation system power cables (6) and at the same time allows the operation of the existing equipment (pivots (30) and pumps (13)) by sending appropriate commands, using the same communication system. Those commands, among other operations, allows the user to switch on/off pivots (30) and pumps (13) and change pivot speed, program several operation parameters and also to collect information regarding operating pressure, flow rates and energy consumption.

The present invention, differs from usual remote control solutions that comprises at least one communication module(s) (preferably gsm/gprs or radio) for each equipment.

The proposed present solution differs from the previous disclosures by the operation principle, i.e., comprising intrinsic communication through the mains line, as well as through the bypass module, being the objective technical problem to be solved: how to improve or modify the previous disclosures in order to accomplish the continuity of communication of the carrier wave through the circuit breaker (7) even when this is opened, due to the bypass module (9) and assure the operator is notified in real time when communication between master(s) and slaves(s) modules is experiencing errors and/or when it is interrupted. We therefore believe the present invention is new, inventive and has wide industrial applicability.

Lisbon, 30 Jun. 2014.

The invention claimed is:

1. A system for operating and monitoring power cables of at least one of a high, medium, or low voltage comprising:
   a tower comprising a power transformer;
   a tower circuit breaker;
   an electric distribution enclosure;
   a master module, comprising a global system for mobile communications/a general packet radio service ("GSM/GPRS") module;
   at least one cable configured to supply power to the master module and high frequency ("HF") communication;
   at least one power transfer cable;
   a circuit breaker;
   a bypass module;
   a plurality of bypass cables configured to connect the circuit breaker to the bypass module;
   a motor/pump comprising connection terminals;
   a slave module;
   a slave cable configured to supply power to the slave module and HF communication; and
   support operative software,
      wherein the master module is located upstream to the at least one power transfer cable and communicates bi-directionally with the slave module, which is located downstream to the at least one power transfer cable, and
      wherein the circuit breaker is located downstream to the at least one power transfer cable and is connected to the bypass module through the plurality of bypass cables.

2. The system according to claim 1, wherein the master module periodically sends a request signal to the slave module and in response to the request signal, the slave module transmits at least one:
   (i) ACK or ACKNOWLEDGE signal, when communication between the two modules is effective;
   (ii) NACK or NOT ACKNOWLEDGE signal, when communication between the two modules is occurring with errors, and in response the master module triggers an alert condition; or
   (iii) no response, when communication between the two modules is interrupted, and in response the master modules triggers an alarm condition.

3. The system according to claim 1, wherein communication between the master module and the slave module is configured to be carried out by injection on the at least one power transfer cable of a high frequency carrier wave, and modulated to represent a state 0 and/or 1 for each bit, wherein each of a group of bits is sent when the high frequency carrier wave is centered at a zero voltage.

4. The system according to claim 1, wherein the circuit breaker is configured to cause interruption of the at least one power transfer cable by opening power contacts, and wherein the bypass module is configured to allow the passage of a high frequency carrier wave in response to the interruption thereby continuing communication.

5. The system according to claim 1, wherein operation and monitoring of the at least one power transfer cable is performed remotely.

6. The system according to claim 1 wherein the master module further comprises:
   a microcontroller;
   a transceiver;
   a power supply;
   a transceiver receiving section ("RX") cable;
   a transceiver transmission section ("TX") cable; and
   a feeder cable.

7. The system according to claim 3, wherein the bypass module comprises at least one inductor-capacitor ("LC") series filter, having a resonant frequency approximately equal to a value of the high frequency carrier wave.

8. The system according to claim 1, wherein slave module comprises:
   a) a microcontroller;
   b) a transceiver;
   c) a power supply;
   d) a transceiver receiving section (RX) cable;
   e) a transceiver transmission section (TX) cable; and
   f) a feeder cable.

9. The system according to claim 1, wherein the support operative software is in a web server, and periodically sends a request signal to the master module and in response to the request signal, the master module transmits at least one of:
   (i) ACK or ACKNOWLEDGE signal, when communication is effective between the web server and the master module;
   (ii) NACK or NOT ACKNOWLEDGE signal, when communication between the web server and the master modules is occurring with errors, and in response the support operative software triggers an alert condition; or
   (iii) no response, when communication between the web server and the master module is interrupted, and in response the support operative software triggers an alarm condition.

10. The system according to claim 1, wherein communication between the master module and the slave module is not interrupted when the GSM/GPRS module is damaged or missing, and an alarm is triggered by the support operative software.

11. The system according to claim 1, wherein communication is interrupted when the at least one power transfer cable is ruptured outside the circuit breaker, and an alarm is triggered by the master module.

12. The system according to claim 1, wherein the at least one cable, the least one power transfer cable, the plurality of bypass cables, or the salve cable comprise at least copper.

13. The system according to claim 1, wherein the system is configured for use in at least one of remotely operating, monitoring and preventing theft and damage of at least one of the at least one cable, the least one power transfer cable, the plurality of bypass cables, the salve cable and the GSM/GPRS module, and
   wherein when communication is determined to be interrupted by the system, an alarm is triggered by the support operative software informing an operator that a deleterious event or attempt, such as a theft, an accident or an attack, has occurred.

14. The system according to claim 1, wherein the system is configured for use in at least one of remotely operating, monitoring and preventing theft and damage of an irrigation system, wherein the irrigation system comprises at least one a power transformer, at least one irrigation pump, at least one irrigation pivot and at least one electric distribution enclosure.

15. The system according to claim 14, wherein the irrigation system further comprises at least one of four irrigation pivots and six electric distribution enclosures.

16. The system according to claim 13, wherein the master module is installed in the electric distribution enclosure, and the one slave module and the bypass module each installed in additional electric distribution enclosures.

17. The system according to claim 15, wherein the master module is installed in the electric distribution enclosure, and further comprising ten slave modules and six bypass modules, wherein the ten slave modules include:
   (i) a slave module installed in the power transformer;
   (ii) a slave module installed in the pump; and
   (iii) two slave modules installed in each of the four irrigation pivots, and wherein each of the six electric distribution enclosures comprise a respective bypass module.

* * * * *